United States Patent [19]

Izutsu et al.

[11] Patent Number: 4,748,169

[45] Date of Patent: May 31, 1988

[54] POLYARYLENE SULFIDE RESIN COMPOSITION

[75] Inventors: Hitoshi Izutsu, Osaka; Toshihide Yamaguchi, Izumi-ohtsu, both of Japan

[73] Assignee: Dainippon Ink and Chemicals, Inc., Tokyo, Japan

[21] Appl. No.: 819,036

[22] Filed: Jan. 15, 1986

[30] Foreign Application Priority Data

Jan. 16, 1985 [JP] Japan .................................. 60-4039
Feb. 28, 1985 [JP] Japan ................................. 60-40138

[51] Int. Cl.$^4$ ............................................. C08L 81/00
[52] U.S. Cl. .................................... 524/500; 524/502; 524/504; 524/505; 525/64; 525/92; 525/189; 525/537
[58] Field of Search ................... 525/64, 92, 189, 537; 524/504, 500, 502, 505

[56] References Cited

U.S. PATENT DOCUMENTS

| T988,008 | 11/1979 | Mayer et al. | 524/500 |
| 4,436,865 | 3/1984 | Beever | 524/504 |
| 4,487,879 | 12/1984 | Needham | 525/92 |
| 4,546,141 | 10/1985 | Gebauer | 524/502 |

FOREIGN PATENT DOCUMENTS

| 55-45704 | 3/1980 | Japan | 525/537 |
| 57-202344 | 12/1982 | Japan | 524/500 |

*Primary Examiner*—Lewis T. Jacobs
*Attorney, Agent, or Firm*—Sherman and Shalloway

[57] ABSTRACT

A polyarylene sulfide resin composition comprising (A) 100 parts by weight of a polyarylene sulfide resin, (B) 0.01 to 30 parts of a polymer containing a fluoro-aliphatic group and having affinity for the resin (A) and a graft or block copolymer having affinity for the resin (A) and hydrophilicity and (C) 0 to 600 parts by weight of a filler. The composition is suitable for use as an encapsulation on material for electronic component parts and a coating agent.

7 Claims, 1 Drawing Sheet

U.S. Patent   May 31, 1988   4,748,169
Fig. 1-a
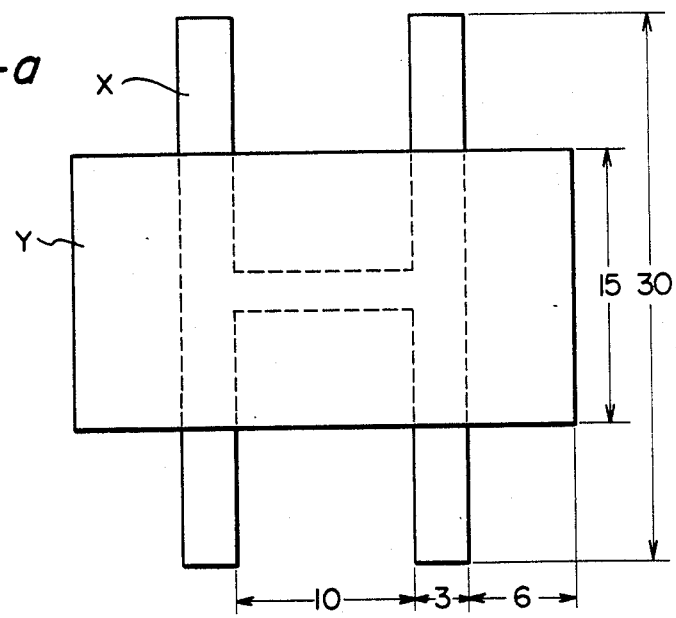
Fig. 1-b
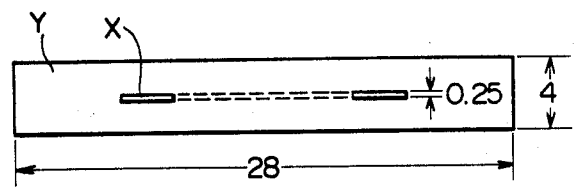
Fig. 2
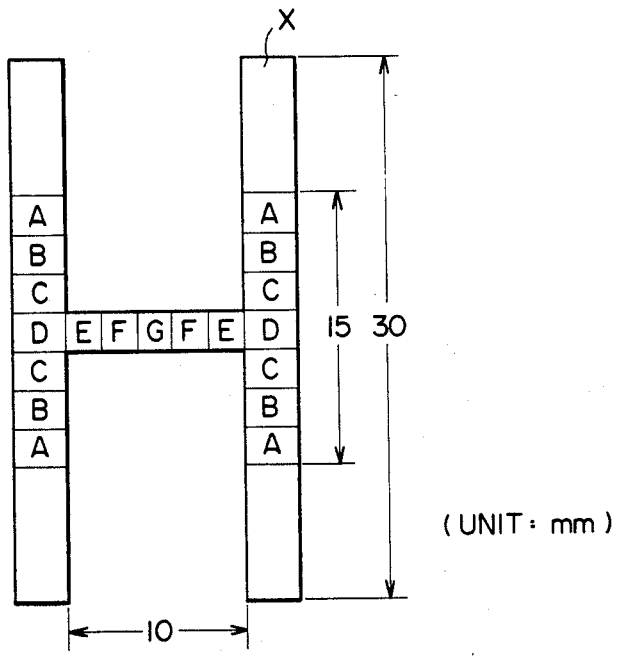
(UNIT: mm)

POLYARYLENE SULFIDE RESIN COMPOSITION

This invention relates to a polyarylene sulfide resin composition having improved moisture resistance and adhesion to metals or fillers. This composition is used as a general injection and extrusion molding material and is also suitable for use as an encapsulation material for electronic component parts such as printed circuit boards, integrated circuits, transistors, capacitors, resistors and diodes, and a coating agent.

Polyarylene sulfide resins have excellent chemical resistance, heat resistance, combustion resistance and mechanical strength, but lack adhesion to metals. Hence, when a polyarylene sulfide resin is applied to printed circuit boards, copper circuits tend to come off from the boards. When the resin is applied to electronic component parts having lead wires, water may come into them along the interface between the lead wires and the resin to reduce their moisture resistance. When it is applied as a surface coating on metal, the coated film will easily come off from the metal.

Attempts have previously been made to overcome these disadvantages by adding silane compounds. This method, however, is scarcely effective.

It is an object of this invention therefore to provide improvements over the prior art.

This object is achieved by a polyarylene sulfide resin composition comprising 100 parts by weight of a polyarylene sulfide resin, 0.01 to 30 parts by weight of a polymer containing a fluoroaliphatic group and having affinity for the resin (A) and/or a graft or block copolymer having affinity for the resin (A) and hydrophilicity and 0 to 600 parts by weight of a filler. Thus, according to this invention, there are provided an electronic component part sealed by the aforesaid resin composition, a printed circuit board molded from the resin composition, and a coating composition comprising the resin composition.

The polyarylene sulfide resin used in this invention denotes non-crosslinked or partially crosslinked polyarylene sulfides and mixtures thereof having a melt flow rate, measured by the method of ASTM D-1238-74 (315.5° C., 5 kg load), of 10 to 10,000 g/10 minutes. The polyarylene sulfide resin is available in various molecular weights depending upon the use to which it is put. For use in encapsulating electronic component parts or in a coating composition, the polyarylene sulfide preferably has a melt flow rate of 1,000 to 10,000 g/10 minutes. For use in a printed circuit board, it preferably has a melt flow rate of 10 to 1,000 g/10 minutes.

The polyarylene sulfide may contain as copolymer components a meta linkage

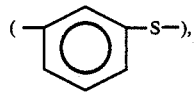

an ether linkage

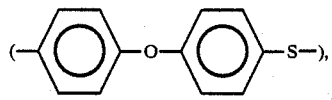

a sulfone linkage

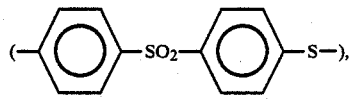

biphenyl linkage

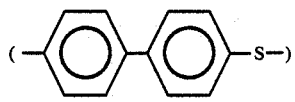

and a substituted phenyl sulfide linkage

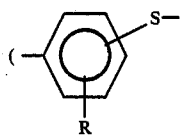

in which R represents an organic group such as alkyl, nitro, phenyl, alkoxy, hydroxyl, carboxyl, amino, halogen or glycidyl), and a trifunctional phenyl sulfide linkage

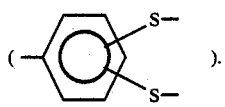

Typical examples of the polyarylene sulfide used in this invention are known polyphenylene sulfide polymers containing at least 90 mole % of structural units represented by the general formula

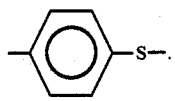

The polymer containing a fluoroaliphatic group and having affinity for the polyarylene sulfide resin used in this invention is, for example, one in which the fluoroaliphatic group has 3 to 20 carbon atoms, preferably 6 to about 12 carbon atoms, and contains 40 to 78% by weight preferably 50 to 77% by weight, of fluorine atoms bonded to the carbon atoms. The terminal portion of the fluoroaliphatic group preferably consists of three fully fluorinated carbon atoms, such as $C_nF_{2n+1}(3 \leq n)$.

The polymer containing a fluoroaliphatic group should have affinity for the polyarylene sulfide resin. Usually, it contains an organic group having affinity for the polyarylene sulfide resin. Examples of such an organic group include alkyl groups preferably having 1 to 30 carbon atoms, alkylidene groups preferably having 1 to 20 carbon atoms, aryl groups, acyl groups, a vinyl group, a vinylidene group, an amino group, an epoxy group, halogens, and a mercapto group.

The fluoroaliphatic group-containing polymer may, for example, be a random, block or graft copolymer of an unsaturated monomer containing a fluoroaliphatic group and an unsaturated monomer containing an organic group which has affinity for the polyarylene sulfide resin, but is not limited thereto. Fluoroaliphatic group-containing acrylates are typical examples of the fluoroaliphatic group-containing unsaturated monomers, and are represented, for example, by the general formula $(Rf)_nX\text{-}A$ in which Rf is a moiety containing a fluoroaliphatic group having 3 to 20 carbon atoms, for example $C_mF_{2m+1}$ ($M=3-20$) or $C_mF_{2m+1}Q$ wherein Q is a linkage by which Rf and X are covalently bonded, for example

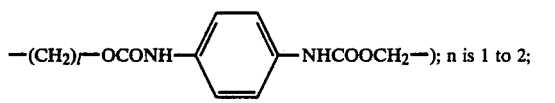
$-(CH_2)_l-OCONH-\langle\text{phenyl}\rangle-NHCOOCH_2-)$; n is 1 to 2;

X is $-SO_2\overset{R}{N}-(CH_2)_l$, $-CO\overset{R}{N}-(CH_2)_l-$, $-COO-(CH_2)_l-$, $-COS(CH_2)_l-$, $-CH_2CH_2-S-(CH_2)_l-$, and

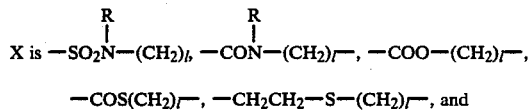
$\underset{/}{\overset{\backslash}{\phantom{.}}}C(CH_3)CH_2OCONH-\langle\text{phenyl}\rangle-NHCOOCH(CH_3)CH_2-$ and A is, for example, $-OCO\overset{R}{C}=CH_2$, $-\overset{R}{C}=CH_2$ or $-O-\overset{R}{C}=CH_2$.

The letter l is an integer of 1 to 10, and R is H or a hydrocarbon group having 1 to 10 carbon atoms.

Examples of the unsaturated monomer with an organic group having affinity for the polyarylene sulfide resins are given below.

(1) Alkyl (preferably $C_1$-$C_{30}$) esters, cycloalkyl (preferably $C_4$-$C_{12}$) esters, aromatic alkyl (preferably $C_7$-$C_{30}$) esters, aryl esters and glycidyl esters of acrylic acid, alpha-substituted acrylic acid and beta-substituted acrylic acid, which are specifically exemplified below.

(i) methyl, ethyl, n-propyl, n-butyl, isobutyl, tert-butyl, 3-pentyl, 2-methyl-1-butyl, n-hexyl, 2-methyl-1-pentyl, 2-ethyl-1-butyl, neopentyl, tert-amyl, 4-methyl-2-pentyl, n-heptyl, 2-heptyl, n-octyl, 2-ethyl-1-hexyl, 2-octyl, n-nonyl, n-decyl, 5-ethyl-2-nonyl, n-dodecyl, n-tetradecyl, 2-methyl-7-ethyl-4-undecyl, n-hexadecyl, n-octadecyl, n-eicosyl, n-pentadecyl, and n-heptadecyl esters of acrylic acid.

(ii) The above acrylates in which the alpha-position is substituted by ethyl, tert-butyl, methoxy, ethoxy, acetoxy, butyroyloxy, benzoyloxy, acetamide, carboethoxyamide, carbopropyloxyamide, formamide, propionamide or isobutyrylamide.

(iii) The above acrylates in which the beta-position is substituted by difluoro, chloro, methyl or ethoxy.

(iv) Cyclohexyl, 1-methylcyclohexyl, 2-methylcyclohexyl, 1-phenylcyclohexyl, 2-chlorohexyl, decahydro-betanaphthyl, phenyl, 1-phenylethyl, 2-phenylethyl, benzyl, p-cyclohexylphenyl, alpha-naphthyl, beta-naphthyl, m-cresyl, o-cresyl, 2-phenoxyethyl, p-chlorophenyl, 2,4-dichlorophenyl, o-chlorobenzyl, p-nitrophenyl and glycidyl esters of acrylic acid or the above alpha-substituted or beta-substituted acrylic acid.

(2) Alkyl (preferably $C_5$-$C_{30}$)-substituted amides of acrylic acid, alpha-substituted acrylic acid and beta-substituted acrylic acid which are specifically exemplified below.

(i) Compounds of the formula $CH_2=CHCONHR_1$ in which $R_1$ represents methyl, ethyl, propyl, n-butyl, tert-butyl, n-heptyl, n-octyl, dodecyl, octadecyl, cyclohexyl, phenyl, p-tolyl, p-nitrophenyl, alpha-naphthyl, beta-naphthyl, o-oxyphenyl, benzyl, oxymethyl or 2-pyridyl.

(ii) Compounds of the formula $CH_2=CHCON(R_2)_2$ in which $R_2$ is methyl, ethyl, n-butyl, 2-ethylhexyl, phenyl or benzyl.

(iii) Compounds of the formula $CH_2=C(CH_3)CONHR_3$ in which $R_3$ represents methyl, ethyl, tert-butyl, 2-ethylhexyl, octadecyl, oxyethyl, cyclohexyl or phenyl.

(3) Alkyl (preferably $C_4$-$C_{30}$) vinyl ethers, alicyclic alkyl (preferably $C_6$-$C_{12}$) vinyl ethers, aromatic alkyl ($C_7$-$C_{30}$) vinyl ethers and aryl vinyl ethers, for example compounds of the formula $CH_2=CHOR$ (in which R is n-propyl, n-amyl, 1-methyl-2-methylpropyl, n-hexyl, 2-ethylbutyl, n-octyl, 1-methylheptyl, n-nonyl, n-decyl, n-tetradecyl, n-hexadecyl, n-octadecyl or oleyl), benzyl vinyl ether, vinyl phenyl ether, vinyl p-chlorophenyl ether, and vinyl alpha-naphthyl ether.

(4) Alkyl (preferably $C_5$-$C_{30}$) vinyl thioethers and aryl vinyl thioethers such as vinyl p-tolylsulfide, vinyl ethyl sulfide, vinyl n-octadecyl sulfide, vinyl n-dodecyl sulfide, vinyl beta-naphthyl sulfide, vinyl benzyl sulfide and vinyl phenyl sulfide.

(5) Fatty acid vinyl esters and aromatic carboxylic acid vinyl esters, such as vinyl caproate, vinyl alpha-ethylcaproate, vinyl caprylate, vinyl laurate, vinyl myristate, vinyl palmitate, vinyl stearate, vinyl nonadecanoate, vinyl behenate, vinyl cerotate, vinyl montanate, vinyl laccerate, vinyl oleate, vinyl linolenate and vinyl benzoate.

(6) Styrene monomers such as styrene, alpha-methylstyrene and p-chlorostyrene.

(7) Aminoalkyl esters of acrylic acid alpha-substituted acrylic acid and beta-substituted acrylic acid, such as methylaminoethyl methacrylate, dimethylaminoethyl methacrylate, methylaminoethyl acrylate, dimethylaminoethyl acrylate and methylaminobutyl methacrylate.

(8) Glycidyl group-containing vinyl monomers such as glycidyl methacrylate and glycidyl acrylate.

(9) Other monomers such as vinylpyridine, N-vinylpyrrolidone and ethoxylated bisphenol A diacrylate.

The fluoroaliphatic group-containing polymer used in this invention preferably has a number average molecular weight of 1,000 to 1,000,000, especially 5,000 to 500,000. If its molecular weight is less than 1000, the adhesion of the resulting resin composition to metals is not appreciably improved. If it exceeds 1,000,000, the compatibility of this polymer with the polyarylene sulfide resin is reduced.

The graft or block copolymer having affinity for the polyarylene sulfide resin and hydrophilicity can usually be obtained by polymerizing a reaction component having a hydrophilic group, a reaction component with an organic moiety having affinity for the polyarylene sulfide resin, and optionally other reaction components. Examples of the reaction component having a hydrophilic group include radicalpolymerizable, addition-polymerizable or polycondensable compounds having a carboxyl group, a hydroxyl group, an amino group, an acid amide group, a sulfonic acid group, a phosphoric acid group, a polyoxymethylene group or an epoxy group as the hydrophilic group. Specific examples include vinyl monomers such as acrylic acid, methacrylic acid, hydroxyethyl methacrylate, acrylamide, dimethylaminoethyl methacrylate, vinylpyridine, N-vinylpyrrolidine, vinylsulfonic acid, diethyl vinyl phosphate, polyoxyethylene monomethacrylate, glycidyl methacrylate, alpha-acetamidoacrylic acid, alpha-ethylacrylic acid, crotonic acid, itaconic acid, maleic acid, fumaric acid, methacrylamide, N-vinylethylamine, N-vinyldimethylamine, N-vinyldiphenylamine, N-vinyl-3-methylpyrrolidone, N-vinylsuccinimide, N-vinyl-epsilon-caprolactam, N-vinyl-butyrolactam, m-vinylphenol, dimethylaminostyrene and p-aminostyrene; polycondensable compounds such as bisphenol A glycidyl ether, polyethylene glycol, polypropylene glycol, polytetramethylene glycol, ethylenediamine, hexamethylenediamine, triethylenetetramine and diethylenetriamine; and amide group-containing self-condensation products such as epsilon-caprolactam and gamma-pyrrolidone. Especially preferred are those which polycondense with a carboxyl group or an acid anhydride group.

Examples of the reaction component having affinity for the polyarylene sulfide resin include (1) unsaturated monomers with an organic group (excepting an epoxy group and an amino group) having affinity for the polyarylene sulfide resin which are cited as examples of the constituent of the fluoroaliphatic group-containing polymer; and (2) polycondensable monomers having the same organic groups as the above unsaturated monomers and preferably containing 4 to 30 carbon atoms such as dibasic acids, glycolic acid and diamines. Specific examples are terephthalic acid, isophthalic acid, diphenylene-p,p'-dicarboxylic acid, naphthalenedicarboxylic acid, diphenylenedicarboxylic acid, cyclohexanedicarboxylic acid, p-hydroxybenzoic acid, p-hydroxyethoxyphenylacetic acid, bisphenol A, bisphenol S, compounds of the formula

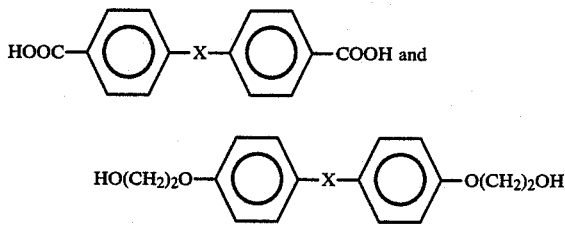

wherein X represents O, S, CO, SO₂, CH₂, CH₂O, (CH₂)₂, (CH₂)₄, S(CH₂)₂S, O(CH₂)₂O(CH₂)₆O, p-phenylenediamine, m-phenylenediamine, p-xylylenediamine, 1,4-diaminocyclohexane, bis- p-aminocyclohexyl)methane and decamethylenediamine.

When a reaction component containing a group which is hydrophilic and has affinity for the polyarylene sulfide resin is used, the graft or block copolymer is obtained by conjointly using another hydrophilic reaction component or a reaction component having affinity for the polyarylene sul-fide resin.

Known methods may be used in the synthesis of the graft or block copolymer used in this invention. A chain transfer method, a radiation-induced grafting method, a mechanical or organic chemical reaction method, a polymer initiator method, a prepolymer condensation method, a macromer method, etc. can be used for the synthesis of the graft copolymer. For example, a graft copolymer in which the trunk is a component having affinity for the polyarylene sulfide resin and the graft is a hydrophilic component can be obtained by radical-polymerizing hydroxyethyl methacrylate in the presence of thioglycollic acid to prepare a prepolymer having a molecular weight of 1000 to 100,000 and containing a carboxyl group at one terminal, reacting the prepolymer with glycidyl methacrylate to form a macromonomer containing a double bond at one terminal, and copolymerizing the macro-monomer with styrene or dodecyl methacrylate.

The block copolymer can be obtained, for example, by subjecting the aforesaid prepolymer having a carboxyl group at one terminal to addition-reaction with an epoxy-terminated polymer or reacting it with a polycondensate whose terminal groups are amino groups, hydroxyl groups or ester groups.

The graft or block copolymer has a molecular weight of preferably 1,000 to 1,000,000, more preferably 3,000 to 500,000. If the molecular weight of the copolymer is less than 1,000, the resulting resin composition does not have satisfactory adhesion to metals. If it exceeds 1,000,000, the compatibility of the copolymer with the polyarylene disulfide resin tends to be reduced.

Preferably, in the graft or block copolymer of this invention, the hydrophilic component and the component having affinity for the polyarylene sulfide resin respectively constitute the trunk and the graft, or blocked. A random copolymer composed merely of a low-molecular-weight monomer having a hydrophilic component and a low-molecular-weight monomer containing a component having affinity for the polyarylene sulfide resin does not appreciably produce the effect intended by this invention.

The amount of the fluoroaliphatic group-containing polymer and/or the graft or blocked copolymer in the composition of this invention is 0.01 to 30 parts by weight, preferably 0.01 to 20 parts by weight, more preferably 0.02 to 15 parts by weight, per 100 parts by weight of the polyarylene sulfide resin. If the amount is less than 0.01 part by weight, the resulting resin composition does not have sufficient improvements in moisture resistance and adhesion to metals or fillers. If it exceeds 30 parts by weight, the inherent properties, such as moisture resistance, heat resistance and chemical resistance, of the polyarylene sulfide resin are greatly deteriorated.

According to the end uses of the composition of this invention, fillers may be incorporated. Examples of the fillers include inorganic fillers such as silica, diatomaceous earth, alumina, titanium oxide, iron oxide, zinc oxide, magnesium oxide, antimony oxide, barium ferrite, strontium ferrite, beryllium oxide, pumice, pumice balloons, alumina fibers, aluminum hydroxide, magnesium hydroxide, basic magnesium carbonate, calcium carbonate, magnesium carbonate, dolomite, dorsonite, calcium sulfate, barium sulfate, ammonium sulfate, calcium sulfite, talc, clay, mica, asbestos, glass fibers, glass balloons, glass beads, calcium silicate, montmorillonite, bentonite, carbon black, graphite, carbon fibers, carbon balloons, iron powder, copper powder, lead powder, aluminum powder, molybdenum sulfide, boron fibers, silicon carbide fibers, brass fibers, potassium titanate, lead titanate zirconate, zinc borate, barium metaborate, calcium borate and sodium borate; and organic fillers such as aromatic polyamide fibers, epoxy resins, phenolic resins, diallyl phthalate resin and other thermosetting resins. The amount of the filler is 0 to 600 parts by weight per 100 parts by weight of the polyarylene sulfide resin. If it exceeds 600 parts by weight, the resulting resin composition undesirably has too high a melt viscosity during use.

The additional use of a silane coupling agent in the composition of this invention can further increase its moisture resistance and adhesion to metals or fillers. Known additives such as lubricants, stabilizers, coloring agents and corrosion inhibitors may also be included in the composition of this invention as required.

The polyarylene sulfide resin composition of this invention can be used, for example, for the production of printed circuit boards by injection molding, encapsulation of electronic component parts, and metal insertion molding, and can give such molded articles having excellent adhesion to metals. Stampable sheets having improved strength and heat resistance may be produced by impregnating the carbon fibers or glass cloths with the composition of this invention and subjecting them to compression molding, and fabricated articles may be produced by using these sheets. The composition of this invention may be applied to a metal substrate by a powder coating method to give a baked coated film having excellent adhesion to the metal substrate.

The following examples illustrate the present invention more specifically.

In the accompanying drawings,

FIG. 1-a is a top plan view of a molded article used for an adhesion test in the following examples;

FIG. 1-b is a side elevation thereof; and

FIG. 2 is a top plan view of a scale for evaluating the degree of penetration of red ink in the adhesion test.

EXAMPLES 1-6 AND COMPARATIVE EXAMPLES 1-2

A polyphenylene sulfide resin (PPS) having various melt flow rates was mixed with each of the fillers indicated in Table 1 and a fluoroacrylate copolymerized oligomer (I, II or III) in the mixing proportions indicated in Table 1 by a Henschel mixer, and then extruded by an extruder to form a PPS composition. A molded article composed of a plate Y of the PPS composition and a metal piece X inserted into the plate Y (the molded article shown in FIGS. 1-a and 1-b) was produced by using the resulting composition and a metal piece (42 alloy; 0.25 mm thick). The molding was carried out by using a 1-ounce injection-molding machine at a cylinder temperature of 320°C. and a mold temperature of 150°C. and under an injection pressure of 200 kg/cm$^2$ (Example 4) or 1,000 kg/cm$^2$ (Examples 1-3, 5 and 6). The adhesion between the metal and the PPS composition in the resulting molded article was examined by the following method of an adhesion test. The results are also shown in Table 1.

Using the resin composition obtained in Example 4, a small signal silicon transistor element was encapsulated under a low injection pressure of 100 kg/cm$^2$, and then subjected to pressure cooker test (2 atmospheres) for 200 hour The ratio of rejection was 0%. When the fluoroacrylate copolymerized oligomer was not used in the above resin composition, the ratio of rejection in this test was 80%.

Adhesion Test

The molded article shown in FIG. 1 (the metal piece encapsulated by the polyphenylene sulfide resin) was put in commercial red ink and immersed for 30 hours at 133° C. and 3 atmospheres in an autoclave. Then, the metal piece X was taken out from the molded article, and the state of adhesion of the red ink to its surface was observed. Which of the areas A to G provided in the scale of FIG. 2 corresponded to the deepest area of the metal piece X to which the red ink adhered was determined, and the degree of penetration of the red ink is expressed by the symbol of the corresponding area A, B, C, D, E, F or G. A shows that the adhesion is very good, and G shows that the adhesion is very bad.

TABLE 1

|  |  | Example 1 | Example 2 | Example 3 | Example 4 | Example 5 | Example 6 | Comparative Example 1 | Comparative Example 2 |
|---|---|---|---|---|---|---|---|---|---|
| Composition (parts by weight) | | | | | | | | | |
| Melt flow rate of PPS used | | 140 | 600 | 1000 | 4900 | 2000 | 50 | 600 | 600 |
| Amount of PPS used | | 100 | 100 | 100 | 100 | 100 | 100 | 100 | 100 |
| Inorganic filler | Type | Glass fibers (3 mm long) | Glass fibers (100 micron long) | Glass fibers (100 micron long) | Quartz | Titanium dioxide | — | Glass fibers (100 micron long) | Glass fibers (100 micron long) |
|  | Amount | 50 | 100 | 185 | 200 | 80 | — | 100 | 100 |
|  | Type | — | Talc | Calcium carbonate | — | — | — | Talc | Talc |
|  | Amount | — | 100 | 15 | — | — | — | 100 | 100 |
| Fluoro-acrylate co-polymerized oligomer | Type | Oligomer I | Oligomer I | Oligomer II | Oligomer III | Oligomer III | Oligomer II | — | — |
|  | Amount | 0.5 | 0.2 | 1.0 | 0.5 | 0.1 | 3.0 | — | — |
| Organic silane | Type | — | — | — | — | — | — | — | Gamma-mercapto-propyltri-methoxysilane |
|  | Amount | — | — | — | — | — | — | — | 0.5 |
| Degree of penetration | | B | C | A | B | C | A | G | G |

Note
Oligomer I:
Graft copolymer having a molecular weight of 80,000 and a fluoroacrylate content of 58% by weight, in which the trunk is polyfluoroacrylate (a polymer mixture of $C_nF_{2n+1}CH_2CH_2OCOCH=CH_2$ in which n is 8, 10, 12 and 14) and the graft is polystyrene having a molecular weight of 3,000.

Oligomer II:
Block copolymer having a molecular weight of 45,000 and a fluoroacrylate content of 27% by weight in which glycidyl methacrylate and styrene are block copolymerized with polyfluoroacrylate of the formula:

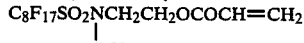

Oligomer III:
Random copolymer having a molecular weight of 100,000 and a fluoroacrylate content of 46% by weight derived from polyfluoroacrylate ($C_8F_{17}CH_2CH_2OCOCH=CH_2$) and polydodecyl methacrylate.

EXAMPLE 7

One hundred parts by weight of PPS having a melt flow rate of 1,000 was mixed with 100 parts by weight of glass fibers having a length of 3 mm and the oligomer II in each of the amounts indicated in Table 2. The mixture was extruded by using an extruder to form a PPS composition. A molded article having the size and shape shown in FIG. 1 was produced by using the PPS composition and a copper piece (0.25 mm thick) in a 1-ounce injection-molding machine at a cylinder temperature of 330° C. and a mold temperature of 130° C. under an injection pressure of 1,500 kg/cm$^2$. The molded article was examined for the adhesion between the metal and the PPS composition in the same way as in Example 1 to 6. The results are shown in Table 2.

TABLE 2

| Amount of the fluoroacrylate polymer (parts by weight) | Degree of penetration |
| --- | --- |
| 0 | G |
| 0.02 | C |
| 0.1 | B |
| 0.5 | A |
| 1 | A |
| 5 | A |

EXAMPLES 8-11 AND COMPARATIVE EXAMPLES 3-4

Polyphenylene sulfide resin having a melt flow rate, measured by the method of ASTM D-1238-74 (315.5° C. under a load of 5 kg) of 5500 was mixed with each of the inorganic fillers indicated in Table 3 and each of the graft or block copolymers in the mixing proportions indicated in Table 3 by a Henschel mixer, and then extruded by an extruder to form a polyphenylene sulfide resin composition. A molded article having the size and shape shown in FIG. 1 was produced by using the resulting resin composition and a copper piece (0.25 mm thick) in a 1-ounce injection molding machine at a cylinder temperature of 310° C. and a mold temperature of 130° C. under an injection pressure of 200 kg/cm$^2$. The molded article was then examined for the adhesion between the metal and the PPS composition in the same way as in Example 1. The results are shown in Table 3.

The composition prepared in Example 8 was electrostatically coated on a steel plate, and cured at 380° C. for 1 hour. The resulting coated film was not at all peeled off in a crosscut tape test. When a composition prepared as in Example 8 without using the graft copolymer I was subjected to the same test, the coated film was peeled entirely from the substrate.

TABLE 3

| | | Example | | | | Comparative Example | |
| --- | --- | --- | --- | --- | --- | --- | --- |
| | | 8 | 9 | 10 | 11 | 3 | 4 |
| Composition (parts by weight) | | | | | | | |
| Polyphenylene sulfide resin | | 100 | 100 | 100 | 100 | 100 | 100 |
| Block or graft copolymer | Type | Copolymer I | Copolymer II | Copolymer III | Copolymer IV | — | Copolymer V |
| | Amount | 3.0 | 0.5 | 0.5 | 1.5 | — | 1.5 |
| Inorganic filler | Type | — | Glass fibers (200 micron long) | Fused silica | Fused silica | Fused silica | Fused silica |
| | Amount | — | 50 | 200 | 150 | 200 | 200 |
| | Type | — | Calcium silicate | — | Glass fibers (30 micron long) | — | Glass fibers (30 micron long) |
| | Amount | — | 50 | — | 50 | — | 50 |
| Degree of penetration | | B | C | C | A | G | F |

Note
Copolymer I:
A graft copolymer having a molecular weight of 35,000 and a hydroxyethyl methacrylate content of 30% by weight derived from polystyrene having a molecular weight of 4,500 as the graft and a copolymer of hydroxyethyl methacrylate and styrene (1:1 by weight) as the trunk.
Copolymer II:
A graft copolymer having a molecular weight of 40,000 and a methacrylic acid content of 20% by weight in which the graft is polymethacrylic acid having a molecular weight of 5,500 and the trunk is poly(stearyl methacrylate).
Copolymer III:
A graft copolymer having a molecular weight of 60,000 and a glycidyl methacrylate content of 15% by weight in which the graft is poly(alpha-chlorostyrene) having a molecular weight of 13000 and the trunk is a copolymer of styrene and glycidyl methacrylate (2:1 by weight)
Copolymer IV:
A block copolymer of polystyrene having a carboxyl group at one terminal and an epoxy-terminated polymer obtained by reacting bisphenol A with epichlorohydrin (molecular weight 20,000; the epoxy-terminated polymer content 20% by weight).
Copolymer V:
An epoxy-terminated random copolymer having a molecular weight of 1,000 obtained by reacting bisphenol A with epichlorohydrin.

EXAMPLES 12-16 AND COMPARATIVE EXAMPLES 5-6

An oxidation-cured polyphenylene sulfide resin (α) having a melt flow rate of 50 obtained by heating uncured polyphenylene sulfide resin having a melt flow rate of 5,000 in air at 260°C., or the non-oxidation-cured, high-molecular-weight polyphenylenesulfide resin (β) disclosed in U.S. Pat. No. 3,919,177 was mixed with each of the inorganic fillers and each of the block or graft copolymers I, II, III and IV in the amounts indicated in Table 4, and extruded by an extruder to form a polyphenylene sulfide resin composition. A copper foil having a thickness of 18 micrometers was superimposed on a molded sheet obtained from the resin composition, and the assembly was compressed at 350° C. The peel strength of the resulting product was measured in accordance with the method of JIS C6481. The results are shown in Table 4.

A printed circuit board molded from the resin composition obtained in Example 12 showed no peeling of a copper circuit applied, and was feasible for practical applications. A printed circuit board molded from the resin composition of Comparative Example 5 was quite useless.

TABLE 4

|  |  | Example |  |  |  |  | Comparative Example |  |
|---|---|---|---|---|---|---|---|---|
|  |  | 12 | 13 | 14 | 15 | 16 | 5 | 7 |
| Composition (parts by weight) | | | | | | | | |
| PPS | Type | α | α | α | β | β | α | β |
|  | Amount | 100 | 100 | 100 | 100 | 100 | 100 | 100 |
| Inorganic filler | Type | Glass fibers (3 mm long) | Glass fibers (300 micron long) | Carbon fibers (200 micron long) | Glass fibers (3 mm long) | — | Glass fibers (3 mm long) | — |
|  | Amount | 150 | 120 | 25 | 150 | — | 150 | — |
|  | Type | — | Calcium carbonate | — | — | — | — | — |
|  | Amount | — | 30 | — | — | — | — | — |
| Block or graft copolymer | Type | I | II | III | IV | III | — | — |
|  | Amount | 1 | 0.05 | 0.2 | 0.5 | 0.5 | — | — |
| Peel strength (g/cm) | | 900 | 500 | 600 | 800 | 700 | 0 | 0 |

What is claimed is:

1. A polyarylene sulfide resin composition useful for encapsulating electronic components by injection-molding, as a coating composition, or for molding into printed circuit boards, said composition comprising:
   (A) 100 parts by weight of polyarylene sulfide resin,
   (B) 0.01 to 30 parts by weight of a polymer containing a fluoroaliphatic group and having affinity for the resin (A), said polymer (B) being a random, block or graft copolymer of an unsaturated monomer containing a fluoroaliphatic group represented by the general formula $(Rf)_n X-A$ wherein Rf represents a fluoroaliphatic group having 3 to 20 carbon atoms, X is $-SO_2N-(CH_2)_l-$, $-CON-(CH_2)_l-$, $-COO-(CH_2)_l-$,
   $\quad\ \ |$ $\qquad\quad\ |$ $\qquad\qquad\ \ |$
   $\quad\ \ R$ $\qquad\quad\ R$ $\qquad\qquad\ \ R$ $-COS(CH_2)_l-$, $-CH_2CH_2-S-(CH_2)_l-$, or $>C(CH_3)CH_2OCONH-\bigcirc-NHCOOCH(CH_3)CH_2-$, A is $-OCOC=CH_2$, $-C=CH_2$ or $-O-C=CH_2$,
   $\qquad\quad\ \ |$ $\qquad\ \ |$ $\qquad\qquad\ |$
   $\qquad\quad\ \ R$ $\qquad\ \ R$ $\qquad\qquad\ R$ R represents H or a hydrocarbon group having 1 to 10 carbon atoms, l is 1 to 10 and n is 1 or 2, and an unsaturated monomer containing an organic group having affinity for the resin (A), and
   (C) 0 to 600 parts by weight of a filler.

2. The composition of claim 1 wherein the polyarylene sulfide resin (A) has a melt flow rate, measured by the method of ASTM D-1238-74 at 315.5° C. under a load of 5 kg, of 10 to 10000 g/10 minutes.

3. The composition of claim 1 wherein the polymer containing a fluoroaliphatic group contains at least one group selected from alkyl groups, alkylidene groups, aryl groups, acyl groups, a vinyl group, a vinylidene group, an ethylenic double bond, an amino group, an epoxy group, a polydimethylcyclohexane group and a mercapto group.

4. The composition of claim 1 wherein the unsaturated monomer containing an organic group is at least one compound selected from the group consisting of alkyl esters, cyclic alkyl esters, aromatic alkyl esters, aryl esters and glycidyl esters of acrylic acid, alpha-substituted acrylic acid and beta-substituted acrylic acid; alkyl-substituted amides of acrylic acid, alpha-substituted acrylic acid and beta-substituted acrylic acid; alkyl vinyl ethers, alicyclic alkyl vinyl ethers, aromatic alkyl vinyl ethers and aryl vinyl ethers; alkyl vinyl thioethers and aryl vinyl thioethers; fatty acid vinyl esters and aromatic carboxylic acid vinyl esters; styrene monomers; aminoalkyl esters of acrylic acid, alpha-substituted acrylic acid and beta-substituted acrylic acid; and glycidyl group-containing vinyl monomers.

5. The composition of claim 1 wherein the fluoroaliphatic group-containing polymer has a number average molecular weight of from 5,000 to 500,000.

6. An encapsulated electronic component comprising an electronic component encapsulated within an injection-molded composition comprising
   (A) 100 parts by weight of polyarylene sulfide resin,
   (B) 0.01 to 30 parts by weight of a polymer containing a fluoroaliphatic group and having affinity for the resin (A), said polymer (B) being a random, block or graft copolymer of an unsaturated monomer containing a fluoroaliphatic group represented by the general formula

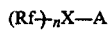

wherein Rf represents a fluoroaliphatic group having 3 to 20 carbon atoms, X is

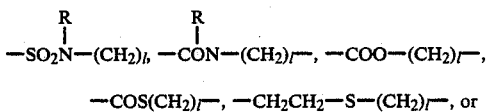

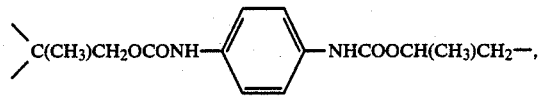

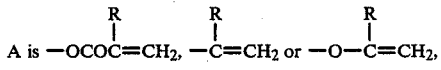

R represents H or a hydrocarbon group having 1 to 10 carbon atoms, l is 1 to 10 and n is 1 or 2, and an unsaturated monomer containing an organic group having affinity for the resin (A), and
   (C) 0 to 600 parts by weight of a filler.

7. A printed circuit board molded with a composition comprising:
   (A) 100 parts by weight of polyarylene sulfide resin,
   (B) 0.01 to 30 parts by weight of a polymer containing a fluoroaliphatic group and having affinity for the resin (A), said polymer (B) being a random, block or graft compolymer of an unsaturated monomer containing a fluoroaliphatic group represented by the general formula

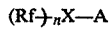

wherein Rf represents a fluoroaliphatic group having 3 to 20 carbon atoms, X is

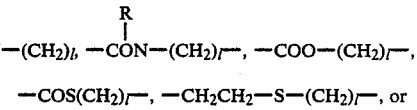

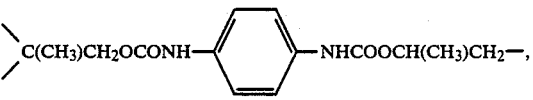

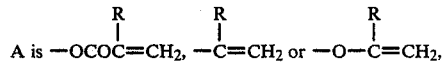

R represents H or a hydrocarbon group having 1 to 10 carbon atoms, l is 1 to 10 and n is 1 or 2, and an unsaturated monomer containing an organic group having affinity for the resin (A), and
   (C) 0 to 600 parts by weight of a filler.

* * * * *